United States Patent [19]
Mizushima

[11] Patent Number: 5,404,045
[45] Date of Patent: Apr. 4, 1995

[54] SEMICONDUCTOR DEVICE WITH AN ELECTRODE PAD HAVING INCREASED MECHANICAL STRENGTH

[75] Inventor: Kazuyuki Mizushima, Tokyo, Japan

[73] Assignee: NEC Corporation, Tokyo, Japan

[21] Appl. No.: 200,582

[22] Filed: Feb. 22, 1994

Related U.S. Application Data

[63] Continuation of Ser. No. 963,076, Oct. 19, 1992, abandoned.

[30] Foreign Application Priority Data

Oct. 19, 1991 [JP] Japan .................. 3-299868

[51] Int. Cl.⁶ .................. H01L 23/48; H01L 29/44; H01L 29/52; H01L 29/60
[52] U.S. Cl. .................. 257/698; 257/786
[58] Field of Search .................. 257/669, 775, 355, 698, 257/691, 692, 784, 786

[56] References Cited

U.S. PATENT DOCUMENTS 4,970,572 11/1990 Kato et al. .................. 257/775
5,117,280 5/1992 Adachi .................. 257/669

FOREIGN PATENT DOCUMENTS 59-2357 1/1984 Japan .................. 257/355

Primary Examiner—Andrew J. James
Assistant Examiner—S. V. Clark
Attorney, Agent, or Firm—Burns, Doane, Swecker & Mathis

[57] ABSTRACT

A semiconductor device according to the present invention includes a lower conductive layer having a plurality of dummy conductive lines in addition to operative conductive lines. The operative and dummy conductive lines are connected to an electrode pad of upper conductive layer by through holes. The upper and lower conductive layers are insulated from each other by an interfacial insulation layer.

9 Claims, 4 Drawing Sheets

SEMICONDUCTOR DEVICE WITH AN ELECTRODE PAD HAVING INCREASED MECHANICAL STRENGTH

This application is a continuation of application Ser. No. 07/963,076, filed Oct. 19, 1992, now abandoned.

FIELD OF THE INVENTION

This invention relates to a semiconductor device, and more particularly to, a semiconductor device having a multilayer-interconnection structure.

BACKGROUND OF THE INVENTION

Recently, a semiconductor device having a multilayer-interconnection structure has been developed in order to increase integration density thereof. Such a semiconductor device includes an upper conductive layer as an electrode pad, a lower conductive layer connected to the electrode pad by a through hole, and an interfacial insulation layer insulating the upper and lower conductive layers from each other.

In one of conventional semiconductor devices, the electrode pad is arranged at an outer periphery of a semiconductor chip to be connected to an external electrode by wire-bonding.

According to the conventional semiconductor device, however, there is a disadvantage in that the number of electrode pads is limited by the size of the semiconductor chip, because the outer periphery of the semiconductor chip is limited in length and area. Otherwise, if the electrode pads are arranged within the semiconductor chip, the pads would cover a large area in the semiconductor chip, so that they prevent a high integration density of the semiconductor device.

Another conventional semiconductor device, which is for area TAB, flip-chip semiconductor or the like, includes an electrode pad arranged within an upper conductive layer.

In this semiconductor device, bumps are formed on the surface of the electrode pad, and connecting portions are formed on a mounting substrate in an arrangement corresponding to that of the bumps, so that the bumps and connecting portions are connected by soldering or the like.

According to the latter conventional semiconductor device, an area of the semiconductor chip can be used effectively as compared with the former semiconductor device. However, there is a disadvantage in that external force is concentrated on the electrode pad when the device is mounted on the substrate by flip-chip bonding, so that the electrode pad is easily separated from the interfacial insulation layer. When organic system coating film is used, such as polyimide which is poor in its ability to adhere to metals, is used as an interfacial insulation film, this tendency is especially large.

SUMMARY OF THE INVENTION

Accordingly, it is an object of the invention to provide a semiconductor device which not only can be adapted to high integration but also has high mechanical strength.

According to a first feature of the invention, a semiconductor device, includes: a lower conductive layer which has a pattern for operative potential and a dummy conductive pattern for non-operative potential; an upper conductive layer for an electrode pad to be connected to an external electrode, the electrode pad being connected to the operative potential pattern and the dummy conductive pattern of the lower conductive layer by a plurality of through holes; and an interfacial insulation layer formed between the lower and upper conductive layers for insulating the lower and upper conductive layers each other.

In this invention, above features are more effective in a situation that the lower and upper conductive layers are of metal, and the interfacial insulation layer is of organic system coating film such as polyimide.

According to a second feature of the invention, a semiconductor device, includes: a lower conductive layer in which a plurality of openings are formed for increasing the amount of surface area of the lower conductive layer; an upper conductive layer for an electrode pad to be connected to an external electrode, the electrode pad being connected to the lower conductive layer by a plurality of through holes; and an interfacial insulation layer formed between the lower and upper conductive layers for insulating the lower and upper conductive layers each other.

In the second feature, the openings are preferably slits. The lower conductive layer is generally a power supply line having a width larger than that of the electrode pad.

The other objects and features of this invention will become apparent from the following description with reference to the accompanying drawings.

DESCRIPTION OF THE PREFERRED EMBODIMENTS

For better understanding of the background of the present invention, the basic principle of the conventional technology is first described hereinafter with reference to FIGS. 1 and 2.

Figure 1:
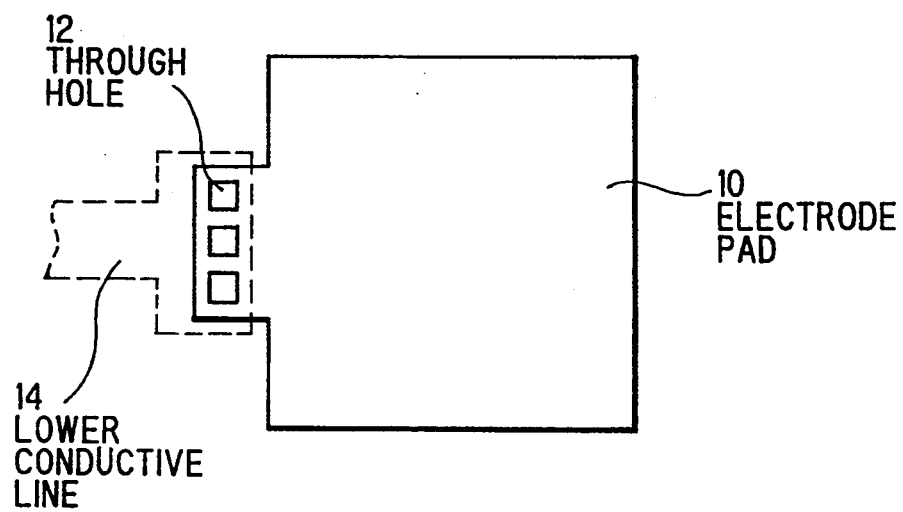
FIG. 1 is a schematic view illustrating a first conventional semiconductor device.

FIG. 1 shows a first conventional semiconductor device, which includes an upper conductive layer as an electrode pad 10, and a lower conductive layer including a conductive line 14 which is connected to the electrode pad 10 by through holes 12.

In the conventional semiconductor device, the electrode pad 10 is arranged at an outer periphery of a semiconductor chip (not shown) to be connected to an external electrode by wire-bonding.

According to the first conventional semiconductor device, however, there is a disadvantage in that the number of electrode pads is limited by size of the semiconductor chip, because the outer periphery of the semiconductor chip is limited in length and area. Otherwise, if the pads are arranged within the semiconductor chip, the pads would cover large area in the semiconductor chip, so that they prevent the high integration of the semiconductor device.

Figure 2:
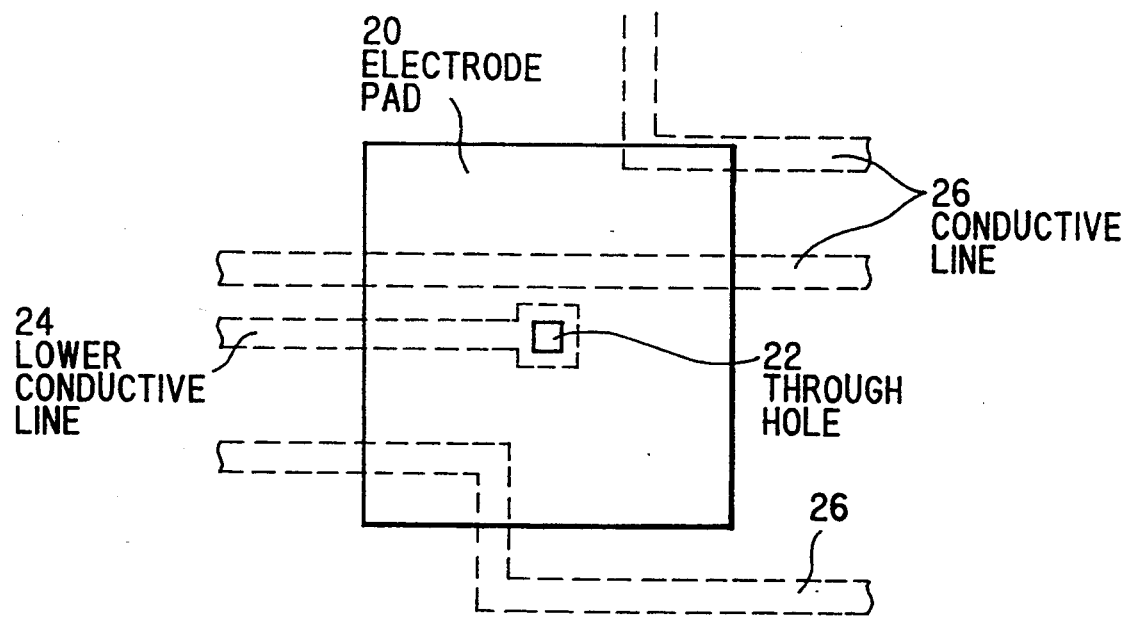
FIG. 2 is a schematic view illustrating a second conventional semiconductor device.

FIG. 2 shows a second conventional semiconductor device, which is for area TAB, flip-chip semiconductor or the like, includes an upper conductive layer as an electrode pad 20, and a lower conductive layer including conductive lines 24 and 26, and an interfacial insulation layer (not shown) for insulating the upper and lower conductive layers each other.

The electrode pad 20 is connected to the lower conductive line 24 by a through hole 22. The conductive lines 26 have electric potential which are different from that of the electrode pad 20.

In the second conventional semiconductor device, bumps are formed on the surface of the electrode pad 20, and connecting portions are formed on a mounting substrate in arrangement corresponding to that of the bumps, so that the bumps and the connecting portions are connected by soldering or the like.

According to the second conventional semiconductor device, area of the semiconductor chip can be used effectively as compared with the first conventional semiconductor device shown in FIG. 1. However, there is a disadvantage in that external force is concentrated on the electrode pad 20 when the device is mounted on the substrate by flip-chip bonding, so that the electrode pad 20 is easily separated from the interfacial insulation layer. The problem is especially apparent if the interfacial insulation layer is organic system coating film such as polyimide.

Figure 3:
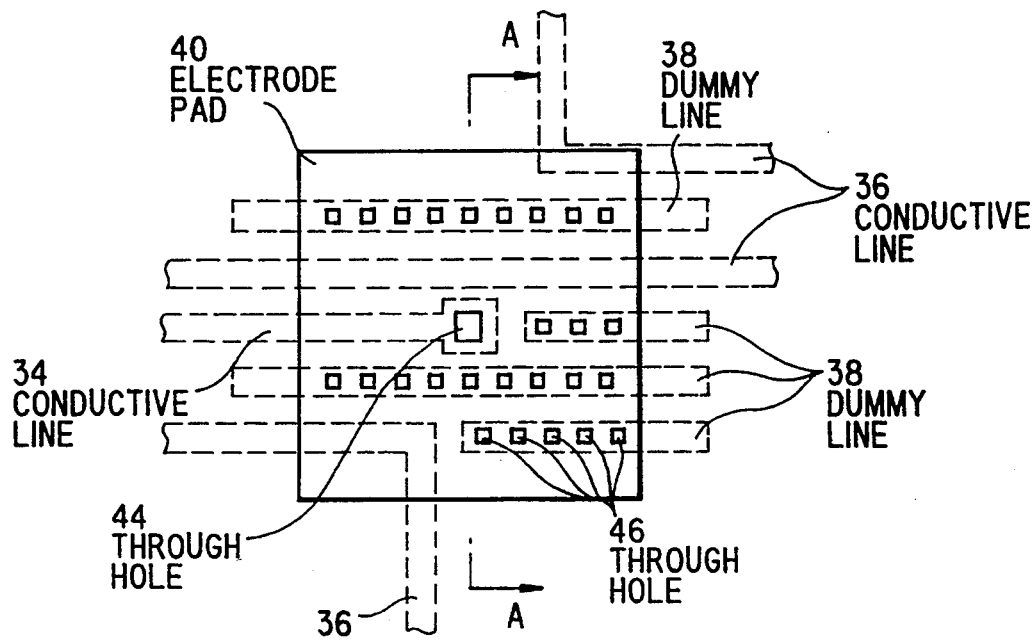
FIG. 3 is a schematic view illustrating a semiconductor device of a first preferred embodiment according to the invention.
Figure 4:
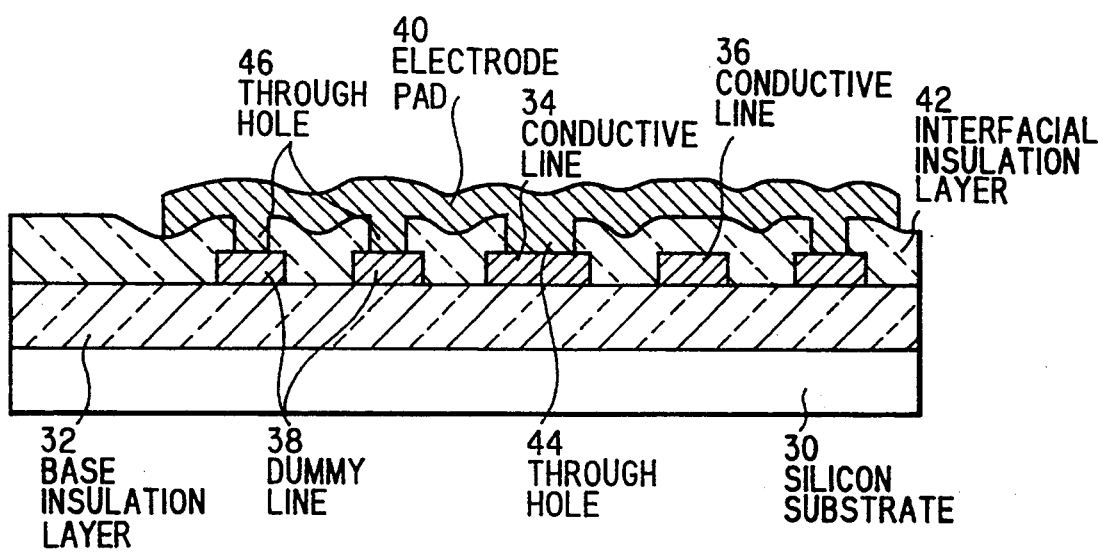
FIG. 4 is a cross-sectional view on line A—A in FIG. 3.

FIGS. 3 and 4 show a semiconductor device of a first preferred embodiment according to the invention. The semiconductor device includes a silicon substrate 30, a base-insulation-layer 32 formed on the silicon substrate 30, a lower conductive layer which is formed on the base-insulation-layer 32, and including conductive lines 34, 36 and 38, an electrode pad 40 of an upper conductive layer, and an interfacial-insulation layer 42 insulating the upper and lower conductive layers each other. The conductive lines 36 are different potential lines, and those identified by reference number 38 are dummy lines.

The electrode pad 40 is connected to the conductive line 34 by a through hole 44, and to the dummy lines 38 by a plurality of through holes 46. The dummy lines 38 have no connection with functions of the device. The conductive lines 36 have electric potential which is different from that of the electrode pad 40, respectively.

According to the first preferred embodiment, amount of contact area between the electrode pad 40 and the interfacial-insulation layer 42 is increased, because the electrode pad 40 is connected to the dummy lines 38 by through hole 46. Therefore, even if an external force is concentrated on the electrode pad 40 when the device is mounted by flip-semiconductor chip bonding, the electrode pad 40 does not separate from the interfacial insulation layer 42. In addition, the amount of contact area between the lower conductive layer and the interfacial-insulation layer 42 is increased, so that contact between the lower conductive layer and the interfacial insulation layer 42 becomes firm.

Figure 5:
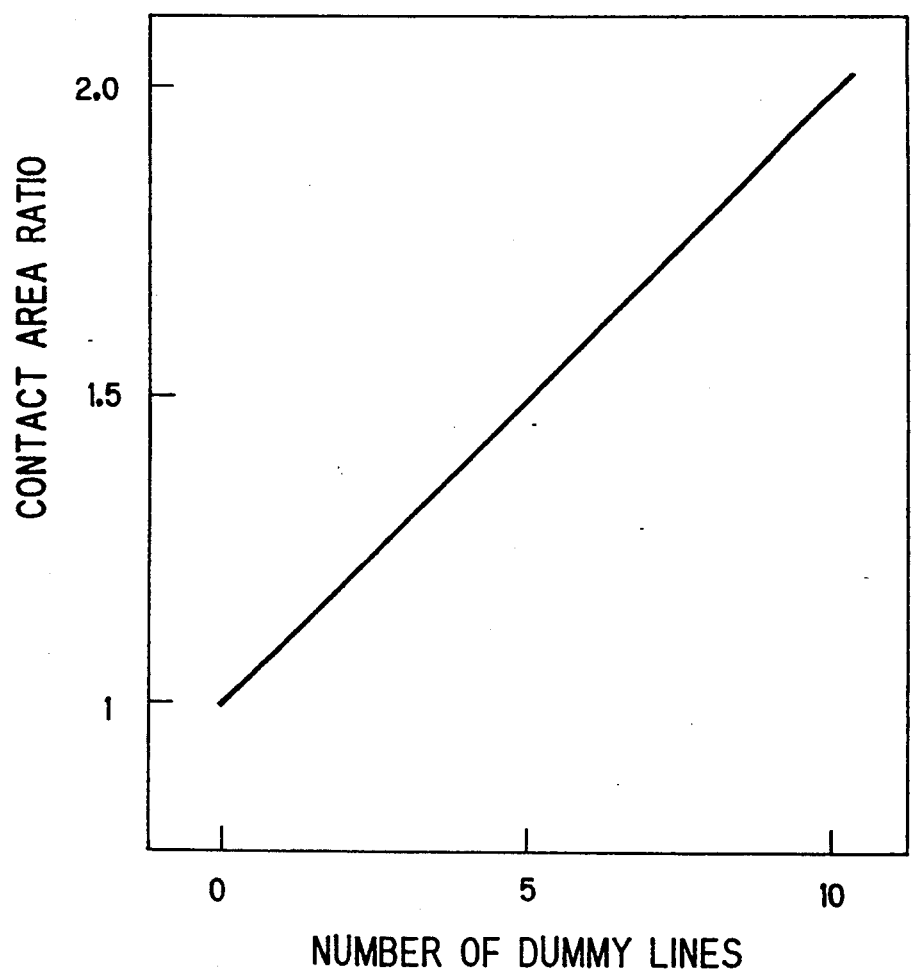
FIG. 5 is a graph showing operation of the first preferred embodiment.

FIG. 5 shows ratio of contact area between an electrode and an interfacial insulation layer relative to the number of dummy lines. In this case, surface area of the electrode is 100 $\mu m \times 100$ $\mu m$, each length of the dummy lines is 100 $\mu m$, each width of the lower conductive lines is 4 $\mu m$, each size of the through holes is 2 $\mu m \times 2$ $\mu m$, pitch of the through holes is 5 $\mu m$. According to the graph, "1" of contact area means the contact area when there is no dummy lines. When ten dummy lines are formed in the lower conductive layer, the total contact area between the electrode pad and the interfacial insulation layer is increased to be two times area in a case of no dummy lines.

Figure 6:
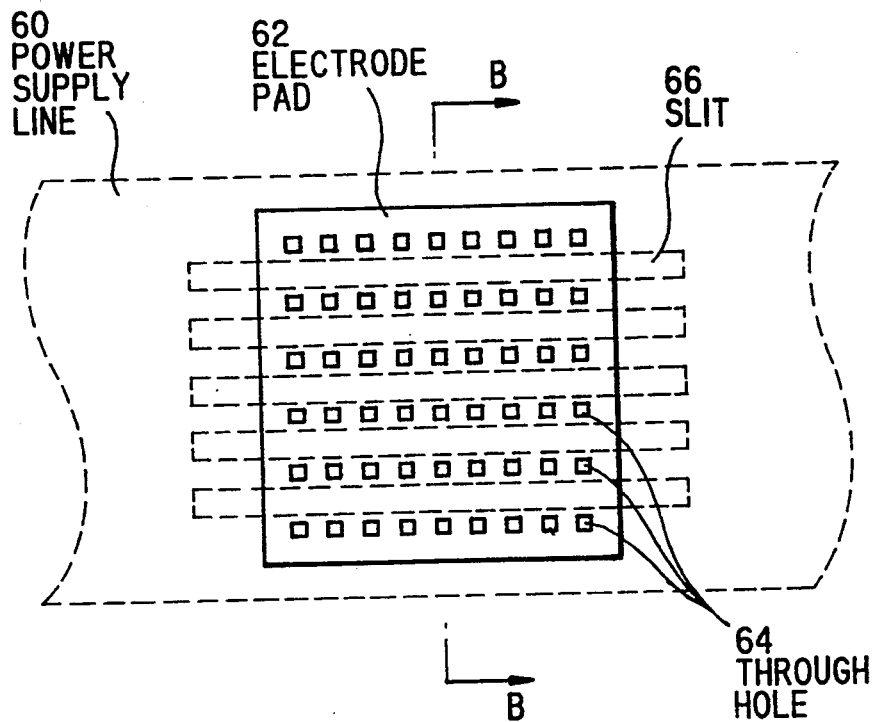
FIG. 6 is a schematic view illustrating a semiconductor device of a second preferred embodiment according to the invention.
Figure 7:
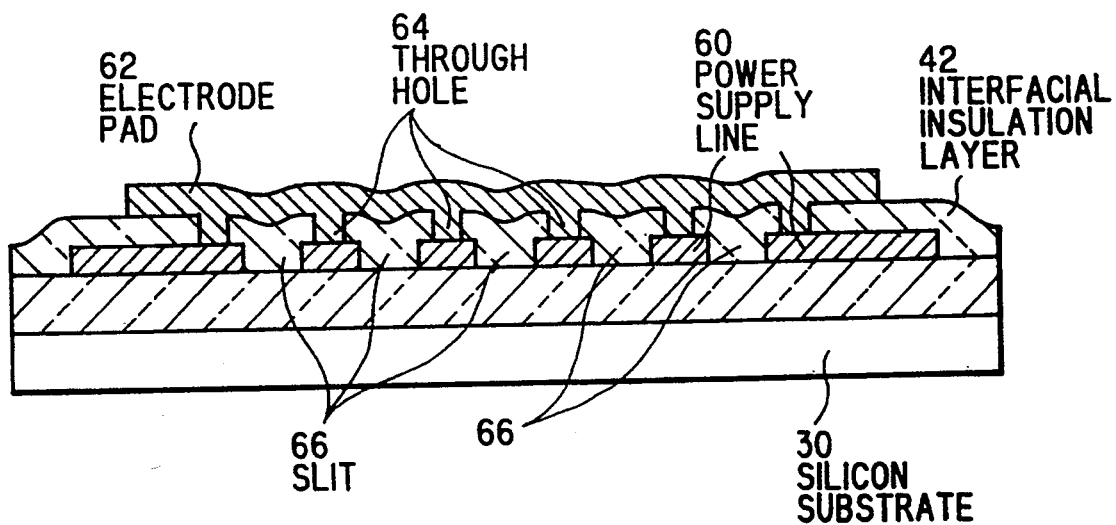
FIG. 7 is a cross-sectional view on line B—B in FIG. 3.

FIGS. 6 and 7 show a semiconductor device of a second preferred embodiment according to the invention. The semiconductor device includes a silicon substrate 30, a base-insulation-layer 32 formed on the silicon substrate 30, a power supply line 60 formed on the base-insulation layer 32, an electrode pad 62 of an upper conductive layer, and an interfacial-insulation layer 42 insulating the upper and power supply lines 60 and 62 each other.

The power supply line 60 has a width larger than that of the electrode pad 62. Five slits 66 are formed on the power supply line 60 having the same width as each other. The electrode pad 62 is connected to the power supply line 60 by a plurality of through holes 64.

According to the second preferred embodiment, the electrode pad 62 has plural through holes 64, so that amount of contact area between the electrode pad 62 and the interfacial-insulation layer 42 is increased. Therefore, the electrode pad 62 has high mechanical strength connection with the interfacial insulation layer 42.

Further, amount of contact area between the power supply line 60 and the interfacial insulation layer 42 is increased, because the power supply line 60 has the slits 66.

Although the invention has been described with respect to specific embodiments for complete and clear disclosure, the appended claims are not to be thus limited but are to be construed as embodying all modification and alternative constructions that may occur to one skilled in the art which fairly fall within the basic teaching herein set forth.

What is claimed is:

1. A semiconductor device comprising:
   a first insulating film covering a semiconductor substrate;
   a first conductive line for conducting a first electric potential and formed on said first insulating film;
   a second conductive line for conducting a second electric potential and formed on said first insulating film apart from said first conductive line;
   a second insulating film covering said first and second conductive lines and said first insulating film;
   an electrode pad formed on said second insulating film to overlap parts of said first and second conductive lines in isolation therefrom by said second insulating film, said electrode pad providing an area for connection to an external electrode;
   a first through hole formed in said second insulating film to connect a portion of said part of said first conductive line to a corresponding portion of said electrode pad;
   at least one dummy line formed between said first insulating film and said second insulating film at a position where said electrode pad is formed to thereby overlap said at least one dummy line in isolation therefrom by said second insulating film; and
   a plurality of second through holes formed in said second insulating film to connect a plurality of portions of said at least one dummy line to corresponding portions of said electrode pad.

2. A semiconductor device in accordance with claim 1, further comprising a plurality of dummy lines.

3. A semiconductor device in accordance with claim 1, further comprising a plurality of dummy lines, each dummy line associated with a plurality of second through holes formed in said second insulating film to connect a plurality of portions of each dummy line to corresponding portions of said electrode pad.

4. A semiconductor device in accordance with claim 1, wherein said second insulating film is an organic system coating film.

5. A semiconductor device in accordance with claim 4, wherein said organic system coating film is polyimide.

6. A semiconductor device in accordance with claim 4, wherein said first and second conductive lines are of metal.

7. A semiconductor device comprising:
a first insulating film covering a semiconductor substrate:
a conductive line formed on said first insulating film;
a second insulating film covering said first conductive line and said first insulating film;
an electrode pad formed on said second insulating film overlapping a part of said conductive line in isolation therefrom by said second insulating film, said electrode pad providing an area for connection to an external electrode;
plurality of slits formed in said part of said conductive line to divide said part of said conductive line into a plurality of segments, wherein at least one of said plurality of slits is longer than a length of said electrode pad; and
a plurality of through holes formed in said second insulating film along each of said segments to connect a plurality of portions of each of said segments to corresponding portions of said electrode pad.

8. A semiconductor device comprising:
a first insulating film covering a semiconductor substrate;
a conductive line formed on said first insulating film;
a second insulating film covering said first conductive line and said first insulating film;
an electrode pad formed on said second insulating film overlapping a part of said conductive line in isolation therefrom by said second insulating film, said electrode pad providing an area for connection to an external electrode;
a plurality of slits formed in said part of said conductive line to divide said part of said conductive line into a plurality of segments, wherein each of said plurality of slits is longer than a length of said electrode pad; and
a plurality of through holes formed in said second insulating film along each of said segments to connect a plurality of portions of each of said segments to corresponding portions of said electrode pad.

9. A semiconductor device comprising:
a first insulating film covering a semiconductor substrate;
a conductive line formed on said first insulating film;
a second insulating film covering said first conductive line and said first insulating film;
an electrode pad formed on said second insulating film overlapping a part of said conductive line in isolation therefrom by said second insulating film, said electrode pad providing an area for connection to an external electrode, wherein a width of said conductive line is greater than a width of said electrode pad;
a plurality of slits formed in said part of said conductive line to divide said part of said conductive line into a plurality of segments; and
a plurality of through holes formed in said second insulating film along each of said segments to connect a plurality of portions of each of said segments to corresponding portions of said electrode pad.

* * * * *